United States Patent
Park et al.

(10) Patent No.: US 8,551,827 B2
(45) Date of Patent: Oct. 8, 2013

(54) METHOD OF FABRICATING ORGANIC LIGHT EMITTING DIODE DISPLAY DEVICE

(71) Applicants: Yong-Hwan Park, Yongin (KR); Kyu-Sik Cho, Yongin (KR); Sang-Ho Moon, Yongin (KR); Byoung-Kwon Choo, Yongin (KR); Min-Chul Shin, Yongin (KR); Tae-Hoon Yang, Yongin (KR); Bo-Kyung Choi, Yongin (KR); Won-Kyu Lee, Yongin (KR); Yun-Gyu Lee, Yongin (KR); Joon-Hoo Choi, Yongin (KR)

(72) Inventors: Yong-Hwan Park, Yongin (KR); Kyu-Sik Cho, Yongin (KR); Sang-Ho Moon, Yongin (KR); Byoung-Kwon Choo, Yongin (KR); Min-Chul Shin, Yongin (KR); Tae-Hoon Yang, Yongin (KR); Bo-Kyung Choi, Yongin (KR); Won-Kyu Lee, Yongin (KR); Yun-Gyu Lee, Yongin (KR); Joon-Hoo Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/771,656

(22) Filed: Feb. 20, 2013

(65) Prior Publication Data
US 2013/0164872 A1    Jun. 27, 2013

Related U.S. Application Data

(62) Division of application No. 12/926,518, filed on Nov. 23, 2010, now Pat. No. 8,389,984.

(30) Foreign Application Priority Data

Jan. 8, 2010 (KR) .................. 10-2010-0001724

(51) Int. Cl.
*H01L 21/00* (2006.01)
(52) U.S. Cl.
USPC ............. 438/149; 438/151; 438/158; 257/40; 257/72; 257/79
(58) Field of Classification Search
USPC ................. 257/40, 72, 79; 438/149, 151, 158
See application file for complete search history.

(56) References Cited

U.S. PATENT DOCUMENTS

| 7,648,861 B2* | 1/2010 | Yamazaki et al. ............ 438/149 |
| 2006/0189047 A1* | 8/2006 | Yamazaki et al. ............ 438/149 |
| 2007/0194323 A1 | 8/2007 | Takano et al. |
| 2009/0102360 A1 | 4/2009 | Kawakami et al. |
| 2010/0038618 A1 | 2/2010 | Takano et al. |

FOREIGN PATENT DOCUMENTS

| JP | 05-072556 A | 3/1993 |
| KR | 10-2005-0047435 A | 5/2005 |
| KR | 10-2006-0001711 A | 1/2006 |

(Continued)

*Primary Examiner* — Telly Green
(74) *Attorney, Agent, or Firm* — Lee & Morse, P.C.

(57) ABSTRACT

An organic light emitting diode display device and a method of manufacturing thereof, the device including a substrate, the substrate including a pixel part and a circuit part; a first semiconductor layer and a second semiconductor layer on the pixel part of the substrate; a gate insulating layer on an entire surface of the substrate; gate electrodes on the gate insulating layer, the gate electrodes corresponding to the first semiconductor layer and the second semiconductor layer, respectively; source/drain electrodes insulated from the gate electrodes, the source/drain electrodes being connected to the first and second semiconductor layers, respectively; a first electrode connected to the source/drain electrodes of the first semiconductor layer; an organic layer on the first electrode; a second layer on the organic layer; and a metal catalyst layer under the first semiconductor layer.

8 Claims, 9 Drawing Sheets

(56) References Cited

FOREIGN PATENT DOCUMENTS

| KR | 10-2006-0042269 A | 5/2006 |
| KR | 10-2007-0012609 A | 1/2007 |
| KR | 10-2007-0070383 A | 7/2007 |
| KR | 10-2008-0009794 A | 1/2008 |
| KR | 10-2008-0010865 A | 1/2008 |
| KR | 10-0805155 B1 | 2/2008 |

* cited by examiner

METHOD OF FABRICATING ORGANIC LIGHT EMITTING DIODE DISPLAY DEVICE

CROSS REFERENCE TO RELATED APPLICATION

This is a divisional application based on pending application Ser. No. 12/926,518, filed Nov. 23, 2010, the entire contents of which is hereby incorporated by reference.

BACKGROUND

1. Field

Embodiments relate to an organic light emitting diode (OLED) display device and a method of fabricating the same.

2. Description of the Related Art

In general, polysilicon layers have advantages including, e.g., high field effect mobility, applicability to high speed circuits, and enablement of complementary metal-oxide semiconductor (CMOS) circuit constitution. Thus, polysilicon layers are widely used for semiconductor layers for TFTs. TFTs using these polysilicon layers are mainly used for active devices of active matrix liquid crystal displays (AMLCDs) and switching devices and driving devices of OLEDs.

Methods of crystallizing amorphous silicon into polysilicon may include, e.g., solid phase crystallization (SPC), excimer laser crystallization (ELS), metal induced crystallization (MIC), metal induced lateral crystallization (MILC), etc.

While the polysilicon layer formed through crystallization using a laser may be advantageous to produce a driving TFT or a switching TFT in an OLED, production of the polysilicon layer may incur a large cost and it may not be readily applied to a large-sized display.

Because of the difficulty in application of the large-sized display, crystallization methods not using a laser are being actively researched.

While a polysilicon layer formed through SPC may have a uniform grain size, the grain size may be too small.

MIC, MILC, and super grain silicon (SGS) crystallization, etc., using a metal catalyst may generate a polysilicon layer having a large grain size.

SUMMARY

Embodiments are directed to an organic light emitting diode (OLED) display device and a method of fabricating the same, which represent advances over the related art.

It is a feature of an embodiment to provide an OLED display device including polysilicon layers optimized to characteristics of a driving TFT and a switching TFT and a method of fabricating the same, thus improving device characteristics.

At least one of the above and other features and advantages may be realized by providing an organic light emitting diode display device including a substrate, the substrate including a pixel part and a circuit part; a first semiconductor layer and a second semiconductor layer on the pixel part of the substrate; a gate insulating layer on an entire surface of the substrate; gate electrodes on the gate insulating layer, the gate electrodes corresponding to the first semiconductor layer and the second semiconductor layer, respectively; source/drain electrodes insulated from the gate electrodes, the source/drain electrodes being connected to the first and second semiconductor layers, respectively; a first electrode connected to the source/drain electrodes of the first semiconductor layer; an organic layer on the first electrode; a second layer on the organic layer; and a metal catalyst layer under the first semiconductor layer.

The first semiconductor layer may be a driving thin film transistor semiconductor layer, and the second semiconductor layer may be a switching thin film transistor semiconductor layer.

The first semiconductor layer may include a polysilicon layer crystallized by a metal catalyst, and the second semiconductor layer may include a polysilicon layer crystallized by solid phase crystallization.

The first semiconductor layer and the second semiconductor layer may have different thicknesses.

The first semiconductor layer may include a metal catalyst.

The first semiconductor layer may include a plurality of polysilicon layers.

The second semiconductor layer may include a single polysilicon layer.

The metal catalyst layer may include at least one of Ni, Pd, Ag, Au, Al, Sn, Sb, Cu, Tr, and Cd.

The organic light emitting diode display device may further include a silicon layer under the metal catalyst layer.

At least one of the above and other features and advantages may also be realized by providing a method of fabricating an organic light emitting diode display device, the method including providing a substrate including a pixel part and a peripheral part; forming a buffer layer on the substrate; forming a first semiconductor layer and a second semiconductor layer on the buffer layer; forming a gate insulating layer on an entire surface of the substrate; forming gate electrodes and source/drain electrodes such that the gate electrodes and source/drain electrodes correspond to the first and second semiconductor layers, respectively; forming an insulating layer on the substrate; and forming a first electrode such that the first electrode is electrically connected to the source/drain electrodes of the first semiconductor layer; forming an organic layer on the first electrode; forming a second electrode on the organic layer; and wherein the first and second semiconductor layers are disposed on the pixel part, forming the first semiconductor layer includes crystallization by a metal catalyst, and forming the second semiconductor layer includes crystallization by solid phase crystallization.

The method may further include forming the first and second semiconductor layers may include forming a metal catalyst layer on the buffer layer in a first thin film transistor region of the substrate; forming a first amorphous silicon layer on the metal catalyst layer; patterning the metal catalyst layer and the first amorphous silicon layer to form a first layer of the first semiconductor layer; forming a second amorphous silicon layer on the entire surface of the substrate; annealing the substrate to crystallize the first layer and the second amorphous silicon layer to form first and second polysilicon layers; and patterning the second polysilicon layer to form a second layer of the first semiconductor layer and the second semiconductor layer in a second thin film transistor region of the substrate.

The second layer of the first semiconductor layer may be formed on the first layer of the first semiconductor layer.

The method may further include forming a silicon layer under the metal catalyst layer.

The first semiconductor layer may be thicker than the second semiconductor layer.

The first and second semiconductor layers may be simultaneously crystallized.

At least one of the above and other features and advantages may also be realized by providing an organic light emitting diode display device including a substrate, the substrate including a pixel part and a circuit part; a plurality of gate electrodes on the pixel part of the substrate; a gate insulating layer on an entire surface of the substrate; a first semiconductor layer and a second semiconductor layer on the gate electrodes; source/drain electrodes, the source/drain electrodes being electrically connected to the first and second semiconductor layers, respectively; a first electrode, the first electrode being connected to the source/drain electrodes of the first semiconductor layer; an organic layer on the first electrode; a second electrode on the organic layer; and a metal catalyst layer under the first semiconductor layer.

The first semiconductor layer may be a driving thin film transistor semiconductor layer, and the second semiconductor layer may be a switching thin film transistor semiconductor layer.

The first semiconductor layer may include a polysilicon layer crystallized by a metal catalyst, and the second semiconductor layer may include a polysilicon layer crystallized by solid phase crystallization.

The first semiconductor layer may include a metal catalyst.

The first semiconductor layer may have a thickness of about 300 to about 1000 Å.

The second semiconductor layer may have a thickness of about 300 to about 700 Å.

The organic light emitting diode display device may further include a contact layer between the first and second semiconductor layers and the source/drain electrodes.

The organic light emitting diode display device may further include a contact layer between the first and second semiconductor layers and the source/drain electrodes corresponding to the first and second semiconductor layers.

At least one of the above and other features and advantages may also be realized by providing a method of fabricating an organic light emitting diode display device, the method including providing a substrate including a first thin film transistor region and a second thin film transistor region; forming a buffer layer on the substrate; forming a metal catalyst layer on the buffer layer on the first thin film transistor region; forming a gate insulating layer on an entire surface of the substrate; forming a first semiconductor layer on the gate insulating layer in the first thin film transistor region; forming a second semiconductor layer on the gate insulating layer in the second thin film transistor layer; forming gate electrodes and source/drain electrodes, such that the gate electrodes and source/drain electrodes correspond to the substrate and the first and second semiconductor layers; forming an insulating layer on the substrate; forming a first electrode such that the first electrode is electrically connected to the source/drain electrodes of the first semiconductor layer; forming an organic layer on the first electrode; and forming a second electrode on the organic layer, wherein the first and second semiconductor layers are disposed in a pixel part of the display device, forming the first semiconductor layer includes crystallization by a metal catalyst, and forming the second semiconductor layer includes crystallization by solid phase crystallization.

The method may further include forming the first and second semiconductor layers may include forming a first amorphous silicon layer on the metal catalyst layer; patterning the metal catalyst layer and the first amorphous silicon layer to form a first layer of the first semiconductor layer; forming a second amorphous silicon layer on the entire surface of the substrate; annealing the substrate to crystallize the first layer and the second amorphous silicon layer to form first and second polysilicon layers; and patterning the second polysilicon layer to form a second layer of the first semiconductor layer and the second semiconductor layer.

The first semiconductor layer may be crystallized after depositing the second amorphous silicon layer on the first amorphous silicon layer.

The method may further include forming a silicon layer under the metal catalyst layer.

The first semiconductor layer may be thicker than the second semiconductor layer.

The first and second semiconductor layers may be simultaneously crystallized.

The method may further include forming a contact layer between the source/drain electrodes corresponding to the first and second semiconductor layers.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
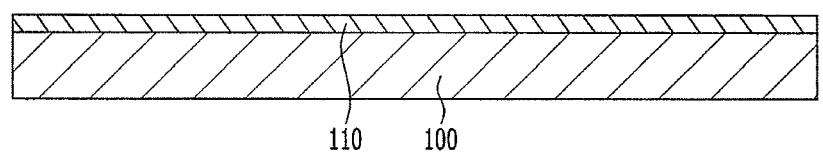
FIGS. 1A to 1H illustrate stages in a method of fabricating an OLED display device in accordance with an embodiment.

Korean Patent Application No. 10-2010-0001724, filed on Jan. 8, 2010 in the Korean Intellectual Property Office, and entitled: "Organic Light Emitting Diode Display Device and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1A to 1H illustrate stages in a method of fabricating an OLED display device in accordance with an embodiment.

First, referring to FIG. 1A, a substrate 100 including a pixel part and a circuit part (not illustrated) may be provided. The substrate 100 may be formed of, e.g., glass or plastic. Then, a buffer layer 110 may be formed on the substrate 100. The buffer layer 110 may be formed of an insulating layer, e.g., a silicon oxide layer or a silicon nitride layer, using, e.g., chemical vapor deposition (CVD) or physical vapor deposition (PVD), in, e.g., a single-layer or multilayer structure.

Figure 1B:
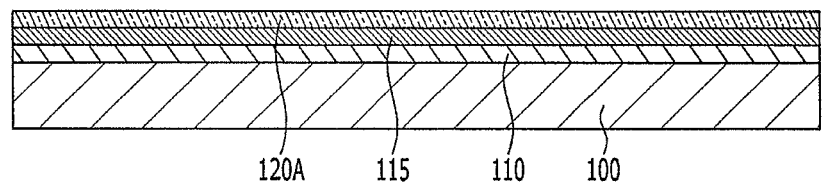

Next, referring to FIG. 1B, a metal catalyst layer 115 and a first amorphous silicon layer 120A may be sequentially deposited on the buffer layer 110. The metal catalyst layer 115 may include, e.g., Ni, Pd, Ag, Au, Al, Sn, Sb, Cu, Tr, and/or Cd. Preferably, the metal catalyst layer 115 includes Ni. In addition, the metal catalyst layer 115 may be formed on the buffer layer 110 to a planar density of about 1011 to 1015 atoms/cm². Maintaining the planar density of the metal catalyst layer at about 1011 atoms/cm² or greater may help ensure that an amount of seeds as nuclei of crystallization is not too small to crystallize the amorphous silicon layer into a polysilicon layer. Maintaining the planar density of the metal catalyst layer at about 1015 atoms/cm² or less may help ensure that an amount of the metal catalyst diffused into the amorphous silicon layer is not increased, thus avoiding an increase in grain particles of the polysilicon layer and an increase in the amount of the remaining metal catalyst, thereby avoiding a degradation of characteristics of a semiconductor layer formed by patterning the polysilicon layer.

Figure 1C:
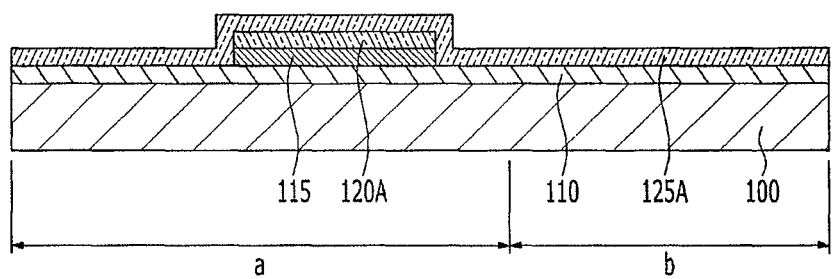

Next, referring to FIG. 1C, the metal catalyst layer 115 and the amorphous silicon layer 120A may be patterned to form a pattern disposed only in a first TFT region (a). Then, a second amorphous silicon layer 125A may be formed on an entire surface of the substrate 100.

Next, the first amorphous silicon layer 120A and the second amorphous silicon layer 125A may be crystallized into first and second polysilicon layers 120B and 125B (see FIG. 1D) on the substrate 100 through annealing, e.g., field enhanced rapid thermal annealing (FERTA).

Figure 1D:
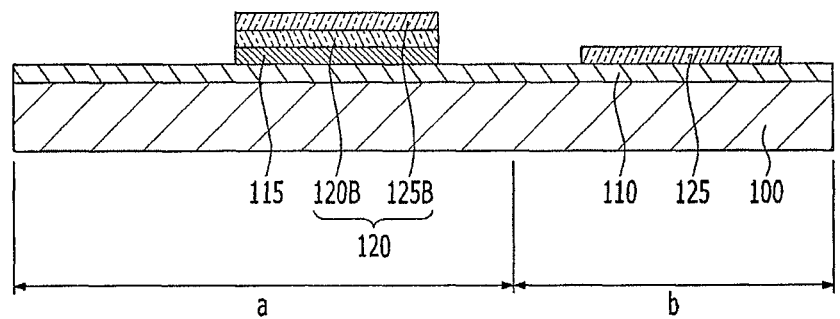

Next, referring to FIG. 1D, the second polysilicon layer 125B disposed in the first TFT region (a) may be patterned on the substrate 100 to form a first semiconductor layer 120 including the first polysilicon layer 120B and the second polysilicon layer 125B. Simultaneously, a second semiconductor layer 125 may be formed by patterning the second polysilicon layer 125B in a second TFT region (b). Here, both of the first semiconductor layer 120 and the second semiconductor layer 125 may be disposed on the pixel part of the substrate 100. The first semiconductor layer 120 may be a semiconductor layer for a driving TFT, i.e., a driving TFT semiconductor layer, and the second semiconductor layer 125 may be a semiconductor layer for a switching TFT, i.e., a switching TFT semiconductor layer. In an implementation, the first semiconductor layer 120 may include a plurality of polysilicon layers. In an implementation, the second semiconductor layer 125 may include a single polysilicon layer.

The first semiconductor layer 120 may be a region in which a metal catalyst of the metal catalyst layer 115 under the first semiconductor layer 120 is diffused and crystallized into the silicon layer. The metal catalyst may remain in the semiconductor layer. The second semiconductor layer 125 may be a polysilicon layer crystallized through, e.g., SPC.

Thus, the first semiconductor layer 120 may have a thickness different from, e.g., may be thicker than, the second semiconductor layer 125. The first semiconductor layer 120 may have a thickness of about 1000 Å or less, e.g., about 300 to about 1000 Å, which may be appropriate to use as semiconductor layers. The second semiconductor layer 125 may have a thickness of about 300 to about 700 Å, which may be appropriate to use as semiconductor layers.

Figure 1E:
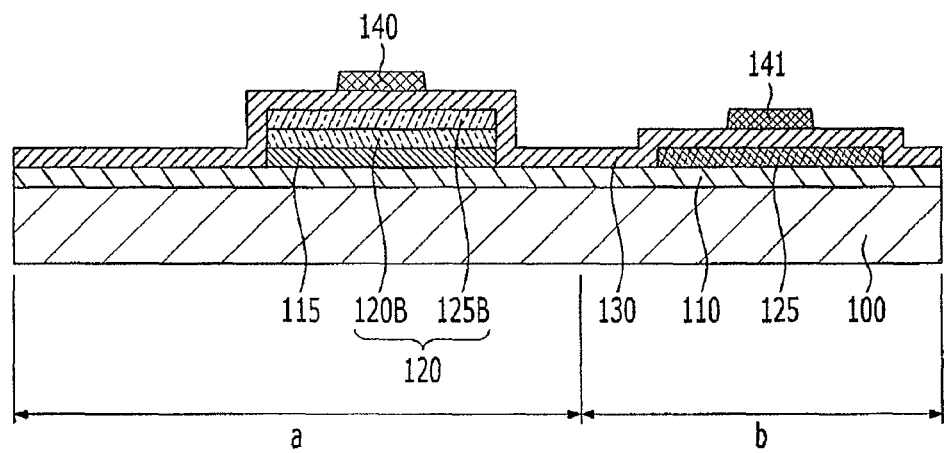

Next, referring to FIG. 1E, a gate insulating layer 130 may be formed on the entire surface of the substrate 100. The gate insulating layer 130 may include, e.g., a silicon oxide layer, a silicon nitride layer, or a dual layer thereof.

Next, gate electrodes 140 and 141 corresponding to the first semiconductor layer 120 and the second semiconductor layer 125, respectively, may be formed on the gate insulating layer 130. The gate electrodes 140 and 141 may be fabricated by, e.g., forming a metal layer for gate electrodes (not shown) in a single-layer structure of aluminum or an aluminum alloy such as Al—Nd or in a multilayer structure in which an aluminum alloy is deposited on a Cr or Mo alloy, and etching the metal layer for gate electrodes through photolithography and etching processes.

Figure 1F:
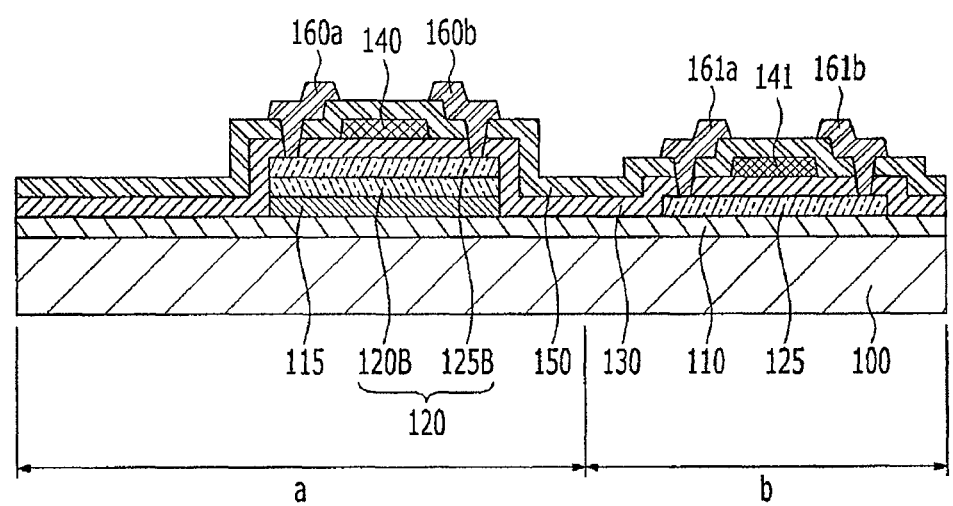

Next, referring to FIG. 1F, after forming an interlayer insulating layer 150 on the entire surface of the substrate 100, source/drain electrodes 160a, 160b, 161a, and 161b connected to the first semiconductor layer 120 and the second semiconductor layer 125, respectively, may be formed. Here, the source/drain electrodes 160a, 160b, 161a, and 161b may include, e.g., Mo, W, MoW, $WSi_2$, $MoSi_2$, and/or Al.

Figure 1G:
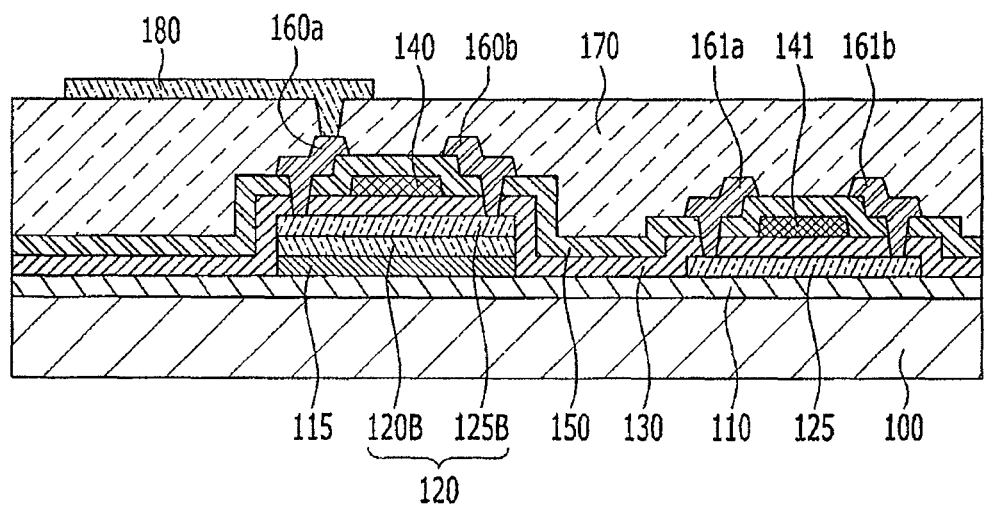

Next, referring to FIG. 1G, after forming an insulating layer 170 on the entire surface of the substrate 100, a first electrode 180 connected to the source/drain electrodes 160a and 160b, i.e., the source/drain electrodes connected to the first semiconductor layer 120, may be formed. The insulating layer 170 may be formed of an inorganic layer, e.g., a silicon nitride layer, a silicon oxide layer, or a multi-layer thereof, or an organic material suitable for use as a planarization layer, e.g., benzocyclobutene (BCB), polyimide (PI), polyamide (PA), acryl resin, or phenol resin. The first electrode 180 may be formed of a transparent conductive layer, e.g., indium tin oxide (ITO), indium zinc oxide (IZO), or a mixed layer thereof, or a reflective layer, e.g., Ag, Al, and alloys thereof.

Figure 1H:
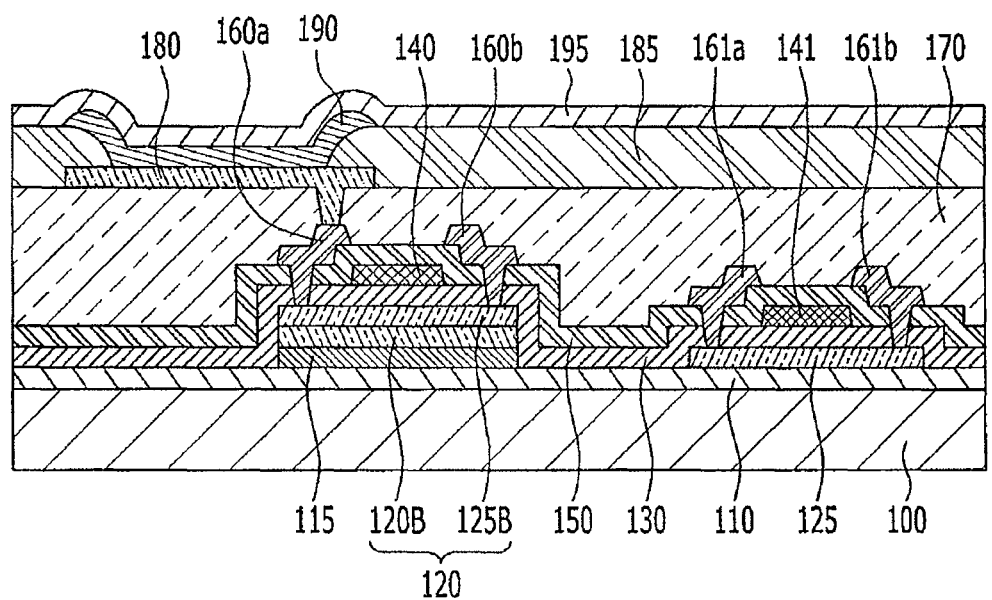

Next, referring to FIG. 1H, after forming a pixel defining layer 185 on the first electrode 180 for defining a pixel, an organic layer 190 including an organic emission layer may be formed on the first electrode 180.

Next, a second electrode 195 may be formed on the entire surface of the substrate 100 to complete an OLED display device.

FIGS. 2A to 2H illustrate stages in a method of fabricating an OLED display device in accordance with another embodiment. Since the present embodiment is similar to the previous embodiment, except for positions of a gate electrode and a semiconductor layer, repeated detailed descriptions of other elements will be omitted.

Figure 2A:
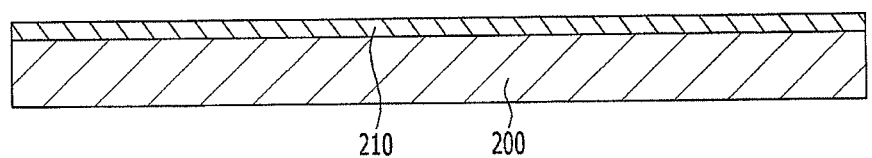
FIGS. 2A to 2H illustrate stages in a method of fabricating an OLED display device in accordance with another embodiment.

First, referring to FIG. 2A, a substrate 200 formed of, e.g., glass or plastic, may be provided. A buffer layer 210 may be formed on an entire surface of the substrate 200.

Figure 2B:
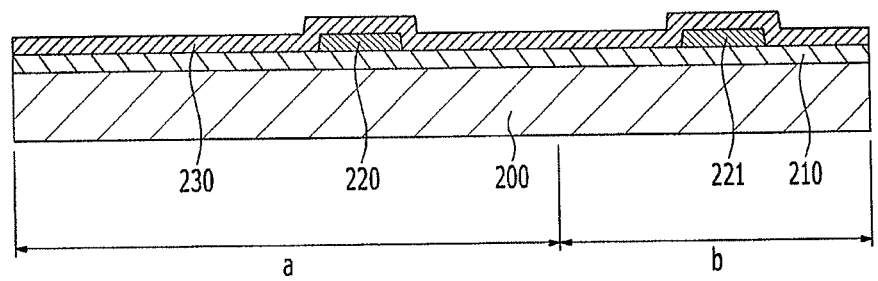

Next, referring to FIG. 2B, gate electrodes 220 and 221 may be formed on the buffer layer 210 in a first TFT region (a) and a second TFT region (b), respectively. Then, a gate insulating layer 230 may be formed on the entire surface of the substrate 200.

Figure 2C:
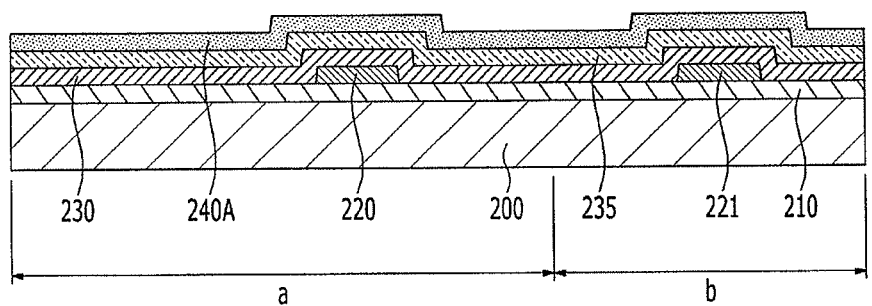
Figure 2D:
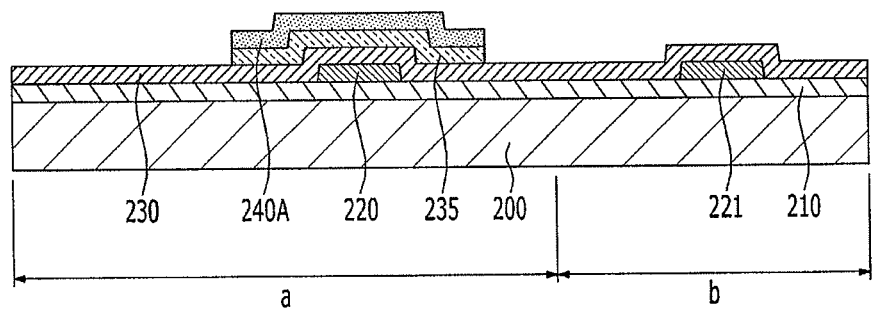

Next, referring to FIGS. 2C and 2D, a metal catalyst layer 235 and a first amorphous silicon layer 240A may be sequentially deposited on the entire surface of the substrate 200. Then, the metal catalyst layer 235 and the first amorphous silicon layer 240A may be patterned to be disposed only in the first TFT region (a) and correspond to the gate electrode 220 of the first TFT region (a).

Figure 2E:
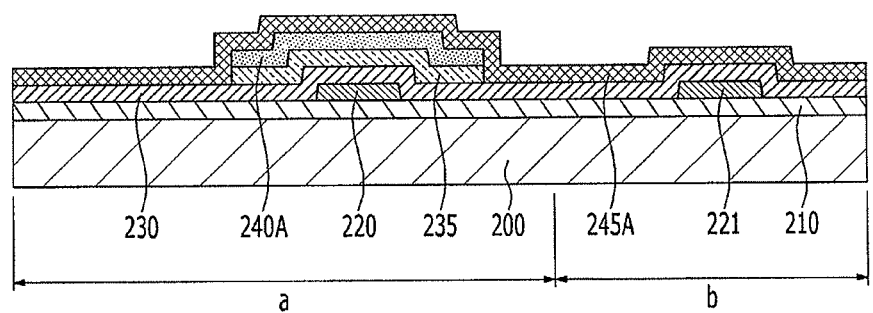

Next, referring to FIG. 2E, a second amorphous silicon layer 245A may be formed on the entire surface of the substrate 200. Then, the first amorphous layer 240A and the second amorphous silicon layer 245A may be crystallized into first and second polysilicon layers 240B and 245B (see FIG. 2F) through, e.g., FERTA, etc.

Figure 2F:
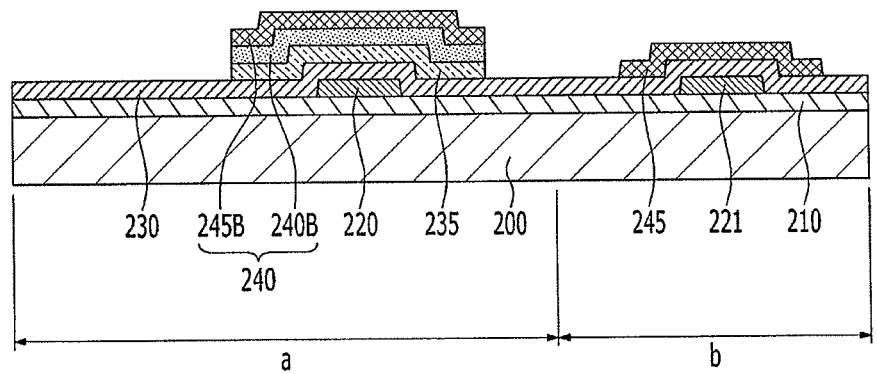

Next, referring to FIG. 2F, the second polysilicon layer 245B formed by crystallizing the second amorphous silicon layer 245A may be patterned to be disposed on the metal catalyst layer 235 and the first polysilicon layer 240B in the first TFT region (a), thereby forming a first semiconductor layer 240 including the first polysilicon layer 240B and the second polysilicon layer 245B. Simultaneously, the second polysilicon layer 245B may be patterned to correspond to the gate electrode 221 disposed in the second TFT region (b) to form a second semiconductor layer 245.

The first semiconductor layer 240 may include a polysilicon layer crystallized by a metal catalyst diffused from the metal catalyst layer 235 under the first semiconductor layer 240 and the metal catalyst may remain in the semiconductor layer. The second semiconductor layer 245 may include a polysilicon layer crystallized through, e.g., SPC.

Similar to the previous embodiment, the first semiconductor layer 240 may be a semiconductor layer for a driving TFT and the second semiconductor layer 245 may be a semiconductor layer for a switching TFT.

Figure 2G:
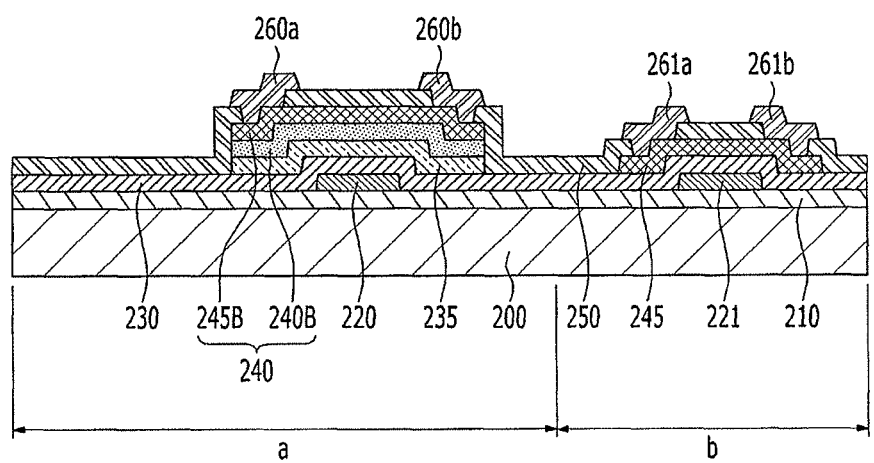

Next, referring to FIG. 2G, in order to protect channel parts (not illustrated) of the first semiconductor layer 240 and the second semiconductor layer 245, an etch stop layer 250 may be formed, and source/drain electrodes 260a, 260b, 261a, and 261b connected to the first semiconductor layer 240 and the second semiconductor layer 245, respectfully, may be formed.

In an implementation, a contact layer (not illustrated) may be disposed between the source/drain electrodes 260a, 260b, 261a, and 261b and the gate electrodes.

Figure 2H:
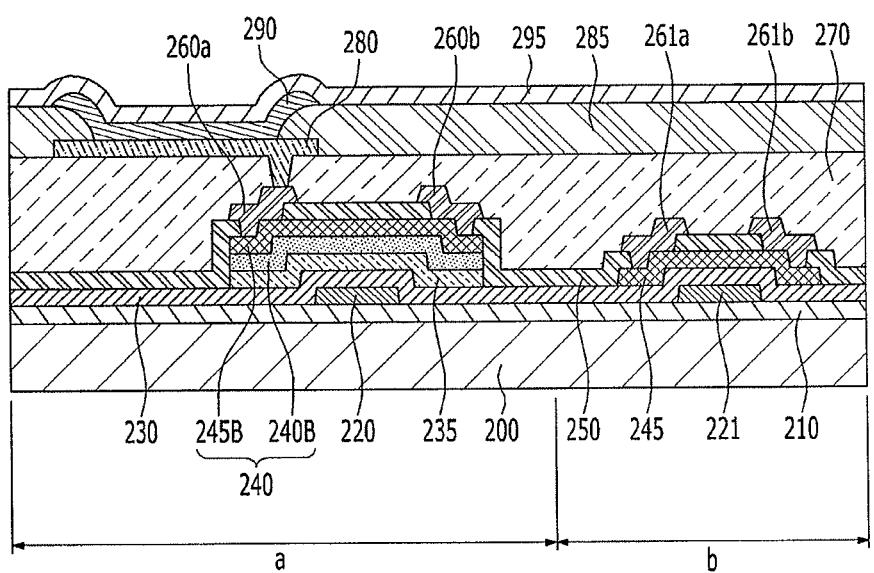

Next, referring to FIG. 2H, similar to the previous embodiment, an insulating layer 270 may be formed on the entire surface of the substrate 200. A first electrode 280 connected to the source/drain electrodes 260a and 260b of the first TFT region (a) may be formed on the insulating layer 270.

Next, a pixel defining layer 285 for defining a pixel may be formed on the first electrode 280. An organic layer 290 including an organic emission layer may be formed on the first electrode 280.

Next, a second electrode 295 may be formed on the entire surface of the substrate 200 to complete an OLED display device.

While the embodiment illustrates the OLED display device including a top gate or bottom gate TFT, the embodiment may be applied to an OLED display device including, e.g., a staggered TFT.

In addition, while the embodiment illustrates the metal catalyst layer directly formed on the buffer layer, a silicon layer may be further disposed under the metal catalyst layer.

As may be seen from the foregoing, a driving TFT may include a semiconductor layer formed of a silicon layer crystallized by a metal catalyst, and a switching TFT may include a semiconductor layer formed of a silicon layer crystallized through annealing using SPC. Thus, devices may be formed to have characteristics appropriate to the TFTs to produce an OLED display device having improved device characteristics.

An embodiment provides an OLED and a method of making the same that is capable of forming silicon layers of a driving thin film transistor (TFT) and a switching TFT disposed in a pixel region to provide different crystalline properties and thus to implement characteristics optimized to each TFT.

The polysilicon layer formed through SPC may have low $I_{off}$ and $I_{on}$ characteristics. The polysilicon layer formed through crystallization using a metal catalyst may have high $I_{off}$ and $I_{on}$ characteristics. Therefore, in the OLED including TFTs formed using both methods, a device satisfying optimal conditions of the driving TFT and the switching TFT may be produced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating an organic light emitting diode display device, the method comprising:
    providing a substrate including a pixel part and a peripheral part;
    forming a buffer layer on the substrate;
    forming a first semiconductor layer and a second semiconductor layer on the buffer layer;
    forming a gate insulating layer on an entire surface of the substrate;
    forming gate electrodes and source/drain electrodes such that the gate electrodes and source/drain electrodes correspond to the first and second semiconductor layers, respectively;
    forming an insulating layer on the substrate;
    forming a first electrode such that the first electrode is electrically connected to the source/drain electrodes of the first semiconductor layer;
    forming an organic layer on the first electrode; and
    forming a second electrode on the organic layer;
    wherein:
        the first and second semiconductor layers are disposed on the pixel part,
        forming the first semiconductor layer includes crystallization by a metal catalyst, and
        forming the second semiconductor layer includes crystallization by solid phase crystallization.

2. The method as claimed in claim 1, wherein forming the first and second semiconductor layers includes:
    forming a metal catalyst layer on the buffer layer in a first thin film transistor region of the substrate;
    forming a first amorphous silicon layer on the metal catalyst layer;
    patterning the metal catalyst layer and the first amorphous silicon layer to form a first layer of the first semiconductor layer;
    forming a second amorphous silicon layer on the entire surface of the substrate;
    annealing the substrate to crystallize the first layer and the second amorphous silicon layer to form first and second polysilicon layers; and
    patterning the second polysilicon layer to form a second layer of the first semiconductor layer and the second semiconductor layer in a second thin film transistor region of the substrate.

3. The method as claimed in claim 2, wherein the second layer of the first semiconductor layer is formed on the first layer of the first semiconductor layer.

4. The method as claimed in claim 2, further comprising forming a silicon layer under the metal catalyst layer.

5. A method of fabricating an organic light emitting diode display device, the method comprising:
    providing a substrate including a first thin film transistor region and a second thin film transistor region;
    forming a buffer layer on the substrate;
    forming a metal catalyst layer on the buffer layer on the first thin film transistor region;
    forming a gate insulating layer on an entire surface of the substrate;
    forming a first semiconductor layer on the gate insulating layer in the first thin film transistor region;
    forming a second semiconductor layer on the gate insulating layer in the second thin film transistor layer;

forming gate electrodes and source/drain electrodes, such that the gate electrodes and source/drain electrodes correspond to the substrate and the first and second semiconductor layers;

forming an insulating layer on the substrate;

forming a first electrode such that the first electrode is electrically connected to the source/drain electrodes of the first semiconductor layer;

forming an organic layer on the first electrode; and forming a second electrode on the organic layer, wherein:

the first and second semiconductor layers are disposed in a pixel part of the display device, forming the first semiconductor layer includes crystallization by a metal catalyst, and forming the second semiconductor layer includes crystallization by solid phase crystallization.

6. The method as claimed in claim 5, wherein forming the first and second semiconductor layers includes:

forming a first amorphous silicon layer on the metal catalyst layer;

patterning the metal catalyst layer and the first amorphous silicon layer to form a first layer of the first semiconductor layer;

forming a second amorphous silicon layer on the entire surface of the substrate;

annealing the substrate to crystallize the first layer and the second amorphous silicon layer to form first and second polysilicon layers; and patterning the second polysilicon layer to form a second layer of the first semiconductor layer and the second semiconductor layer.

7. The method as claimed in claim 6, wherein the first semiconductor layer is crystallized after depositing the second amorphous silicon layer on the first amorphous silicon layer.

8. The method as claimed in claim 6, further comprising forming a silicon layer under the metal catalyst layer.

* * * * *